(12) United States Patent
Hormati

(10) Patent No.: US 11,374,800 B1
(45) Date of Patent: Jun. 28, 2022

(54) CONTINUOUS TIME LINEAR EQUALIZATION AND BANDWIDTH ADAPTATION USING PEAK DETECTOR

(71) Applicant: Kandou Labs SA, Lausanne (CH)

(72) Inventor: Ali Hormati, Ecublens Vaud (CH)

(73) Assignee: KANDOU LABS SA, Lausanne (CH)

( * ) Notice: Subject to any disclaimer, the term of this patent is extended or adjusted under 35 U.S.C. 154(b) by 0 days.

(21) Appl. No.: 17/230,731

(22) Filed: Apr. 14, 2021

(51) Int. Cl.
*H04L 25/03* (2006.01)
*H04L 27/32* (2006.01)

(52) U.S. Cl.
CPC ........ *H04L 25/03057* (2013.01); *H04L 27/32* (2013.01)

(58) Field of Classification Search
CPC ....... G06F 13/42; H06F 13/4282; H03H 7/00; H03H 7/30; H03K 5/00; H03K 5/159; H03M 1/00; H03M 1/06; H03M 1/12; H03M 1/22; H03M 1/34; H04B 1/38; H04L 7/00; H04L 7/027; H04L 25/03; H04L 25/04; H04L 25/06; H04L 25/10; H04L 25/03057; H04L 27/01; H04L 27/32; H04L 27/2647
USPC ................. 330/253; 375/219, 229–233, 317; 708/322–323
See application file for complete search history.

(56) References Cited

U.S. PATENT DOCUMENTS

| | | |
|---|---|---|
| 3,636,463 A | 1/1972 | Ongkiehong |
| 3,824,494 A | 7/1974 | Wilcox |
| 3,939,468 A | 2/1976 | Mastin |
| 4,276,543 A | 6/1981 | Miller et al. |
| 4,774,498 A | 9/1988 | Traa |
| 4,897,657 A | 1/1990 | Brubaker |
| 5,017,924 A | 5/1991 | Guiberteau et al. |
| 5,459,465 A | 10/1995 | Kagey |
| 5,510,736 A | 4/1996 | Van |
| 5,748,948 A | 5/1998 | Yu et al. |
| 5,777,568 A | 7/1998 | Inoue |
| 5,793,254 A | 8/1998 | Oconnor |
| 5,945,935 A | 8/1999 | Kusumoto et al. |
| 6,094,075 A | 7/2000 | Garrett et al. |
| 6,226,330 B1 | 5/2001 | Mansur |
| 6,232,908 B1 | 5/2001 | Nakaigawa |
| 6,346,907 B1 | 2/2002 | Dacy et al. |

(Continued)

FOREIGN PATENT DOCUMENTS

| | | |
|---|---|---|
| EP | 0425064 A2 | 5/1991 |
| WO | 2018052657 A1 | 3/2018 |
| WO | 2019241081 A1 | 12/2019 |

OTHER PUBLICATIONS

Anadigm, "Using the Anadigm Multiplier CAM", Design Brief 208, www.anadigm.com, Copyright 2002, 2002, (6 pages).

(Continued)

*Primary Examiner* — Shawkat M Ali
(74) *Attorney, Agent, or Firm* — Invention Mine LLC

(57) ABSTRACT

Methods and systems are described for asynchronously measuring an equalized information signal to obtain amplitude information, modifying frequency dependent parameters of a continuous-time linear equalization (CTLE) component of the signal path, determining a correlation between CTLE parameters and signal amplitude, and adjusting, responsive to the correlation, a continuous-time linear equalization (CTLE) code of a CTLE to adjust equalization of the equalized information signal.

20 Claims, 8 Drawing Sheets

(56) References Cited

U.S. PATENT DOCUMENTS

| | | | |
|---|---|---|---|
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,546,063 B1 | 4/2003 | Lee et al. |
| 6,563,382 B1 | 5/2003 | Yang |
| 6,624,699 B2 | 9/2003 | Yin et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,560,957 B2 | 7/2009 | Chen et al. |
| 7,635,990 B1 | 12/2009 | Ren et al. |
| 7,656,321 B2 | 2/2010 | Wang |
| 7,683,720 B1 | 3/2010 | Yehui et al. |
| 7,688,102 B2 | 3/2010 | Bae et al. |
| 7,688,887 B2 | 3/2010 | Gupta et al. |
| 7,697,915 B2 | 4/2010 | Behzad et al. |
| 7,804,361 B2 | 9/2010 | Lim et al. |
| 7,822,113 B2 | 10/2010 | Tonietto et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,045,608 B2 | 10/2011 | Dai et al. |
| 8,074,126 B1 | 12/2011 | Qian et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,537,886 B1 | 9/2013 | Shumarayev et al. |
| 8,547,272 B1 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,704,583 B2 | 4/2014 | Bulzacchelli et al. |
| 8,744,012 B1 | 6/2014 | Ding et al. |
| 8,791,735 B1 | 7/2014 | Shibasaki |
| 8,841,936 B2 | 9/2014 | Nakamura |
| 8,860,590 B2 | 10/2014 | Yamagata et al. |
| 8,861,583 B2 | 10/2014 | Liu |
| 9,069,995 B1 | 6/2015 | Cronie |
| 9,106,462 B1 * | 8/2015 | Aziz .................. H04L 25/03057 |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,292,716 B2 | 3/2016 | Winoto et al. |
| 9,300,503 B1 | 3/2016 | Holden et al. |
| 9,705,708 B1 * | 7/2017 | Jin .................... H04L 25/03885 |
| 9,755,599 B2 | 9/2017 | Yuan et al. |
| 10,003,315 B2 | 6/2018 | Tajalli |
| 10,326,623 B1 | 6/2019 | Tajalli |
| 10,491,365 B1 * | 11/2019 | Lin ....................... H04L 43/028 |
| 10,791,009 B1 * | 9/2020 | Wu ....................... H04L 7/0029 |
| 10,931,249 B2 | 2/2021 | Rattan et al. |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0008099 A1 | 1/2005 | Brown |
| 2005/0057379 A1 | 3/2005 | Jansson |
| 2005/0218980 A1 | 10/2005 | Kalb |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0097579 A1 | 5/2007 | Amamiya |
| 2007/0104299 A1 | 5/2007 | Cahn et al. |
| 2007/0159247 A1 | 7/2007 | Lee et al. |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2007/0285156 A1 | 12/2007 | Roberts et al. |
| 2008/0001626 A1 | 1/2008 | Bae et al. |
| 2008/0107209 A1 | 5/2008 | Cheng et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0146719 A1 | 6/2009 | Pernia et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2010/0329322 A1 | 12/2010 | Mobin et al. |
| 2010/0329325 A1 | 12/2010 | Mobin et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2012/0249217 A1 | 10/2012 | Fukuda et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0087610 A1 | 3/2016 | Hata |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0302267 A1 | 10/2017 | Luo |
| 2017/0309346 A1 | 10/2017 | Tajalli et al. |
| 2018/0076985 A1 | 3/2018 | Schell |
| 2018/0083638 A1 | 3/2018 | Tajalli |
| 2019/0199557 A1 | 6/2019 | Taylor et al. |

(56) References Cited

U.S. PATENT DOCUMENTS

| | | |
|---|---|---|
| 2019/0221153 A1 | 7/2019 | Tsuchi et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |
| 2021/0281449 A1* | 9/2021 | Wang ................ H04L 25/03885 |

OTHER PUBLICATIONS

Dickson, Timothy, et al., "A 1.8 pJ/bit 16×16 Gb/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young, et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

Schneider, J., et al., "ELEC301 Project: Building an Analog Computer", http://www.clear.rice.edu/elec301/Projects99/anlgcomp/, Dec. 19, 1999, (9 pages).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Won, Hyosup, et al., "A 28-Gb/s Receiver With Self-contained Adaptive Equalization and Sampling Point Control Using Stochastic Sigma-Tracking Eye-Opening Monitor", IEEE Transactions on Circuits and Systems-I: Regular Papers, vol. 64, No. 3, Mar. 2017, 664-674 (11 pages).

Bae, Joonsung, et al., "Circuits and Systems for Wireless Body Area Network", Electromagnetics of Body-Area Networks: Antennas, Propagation, and RF Systems, First Edition, 2016, 375-403 (29 pages).

* cited by examiner

Waveform 410
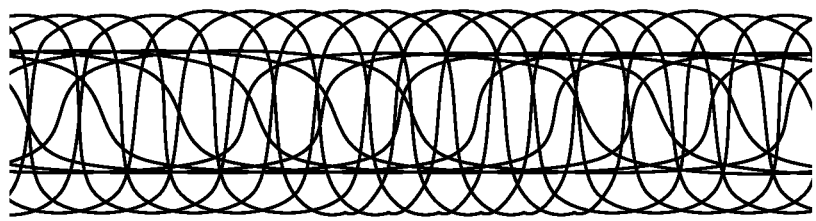
Waveform 420
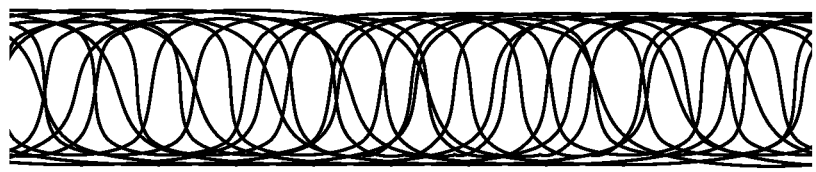
Waveform 430
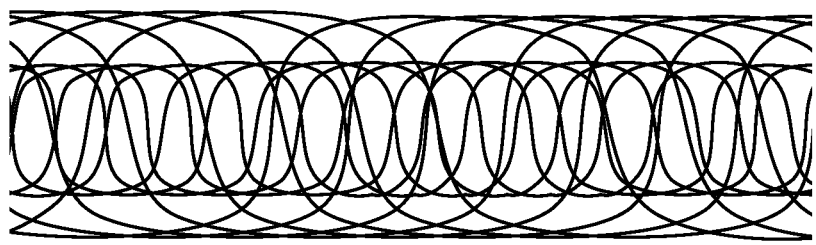
FIG. 4

CONTINUOUS TIME LINEAR EQUALIZATION AND BANDWIDTH ADAPTATION USING PEAK DETECTOR

REFERENCES

The following references are herein incorporated by reference in their entirety for all purposes:

U.S. patent Ser. No. 10/931,249, issued Feb. 23, 2021, of U.S. application Ser. No. 16/378,461, filed Apr. 8, 2019, naming Suhas Rattan and Kiarash Gharibdoust, herein referred to as [Rattan].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods, with the data encoded as signal amplitude variations, i.e. using Pulse Amplitude Modulation (PAM). In applications requiring high speed communications, those methods can be further optimized in terms of power consumption and pin-efficiency, especially in high-speed communications. More recently, vector signaling methods such as described in [Shokrollahi] have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints.

Regardless of the method used, the received signals presented to the receiving device are sampled (or their signal value otherwise recorded) at intervals best representing the original transmitted values, regardless of transmission channel delays, interference, and noise. This Clock and Data Recovery (CDR) or Clock Data Alignment (CDA) not only must determine the appropriate sample timing, but must continue to do so continuously, providing dynamic compensation for varying signal propagation conditions. It is common for communications receivers to extract a receive clock signal from the received data stream. Historically, such extraction required sampling of the received signal at both the center of each receive unit interval (UI) to obtain the data value, and at the UI edge to sample the signal transition or edge for clock alignment. So-called baud-rate CDA systems have been developed which can obtain both data and clock information simultaneously.

Real-world communications channels are imperfect, degrading transmitted signals in both amplitude (e.g. attenuation) and timing (e.g. delay and pulse smearing) which may be addressed via transmitter pre-compensation and/or receive equalization. Continuous time linear equalization (CTLE) is one known approach to frequency domain equalization, in one example providing compensation for increased channel attenuation at high frequencies. Time-domain-oriented equalization methods are also used to compensate for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. Here, the time-domain oriented equalization is performed by maintaining a history of previously-received data values at the receiver, which are processed by a transmission line model to predict the expected influence that each of the historical data values would have on the present receive signal. Such a transmission line model may be pre-calculated, derived by measurement, or generated heuristically, and may encompass the effects of one or more than one previous data interval. The predicted influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision is resolved.

BRIEF DESCRIPTION

A digital receiver system samples received signals in both amplitude and time, obtaining sufficient information to permit accurate detection and decoding of the transmitted data regardless of signal degradations induced by the communications medium. Addressing the particular characteristics of the communications medium may require signal amplification, frequency- and time-domain filtering, as well as accurate adjustment of both the time and amplitude at which sampling occurs. In an advanced receiver design, this optimal operating point is maintained by a delicate balance of signal equalization and clock sample timing, with both signal equalization (using DFE) and clock synchronization (using data transition detection) being dependent on accurate detection of prior data values. This creates a "chicken and egg" condition at system startup, where correct detection of data values requires proper adjustment of equalization and clock timing, which are themselves dependent on data having been detected correctly.

To facilitate timely initialization of a data receiver, one embodiment extracts amplitude-related information from the incoming signal stream before the receive clock system has extracted enough synchronization information to produce a stable, locked clock reference. These asynchronous measurements of receive signal amplitude variations as frequency-dependent equalization parameters are changed can facilitate entry into normal receiver operation.

Methods and apparatus are described to obtain a signal peak value associated with high frequency energy of a pulse-amplitude modulated (PAM) data signal at an output of a CTLE using a peak detector, incrementally reducing equalization of the PAM data signal via changes to an equalization code to increase low frequency energy of the PAM data signal, detecting an increase in the signal peak value of the PAM data signal relative to the signal peak value associated with the high frequency energy of the PAM data signal, the increase responsive to a change in the equalization code, and outputting the equalization code the equalization code associated with the increase in the signal peak value.

BRIEF DESCRIPTION OF FIGURES

FIG. 4 illustrates the asynchronous outputs of a CTLE configured to different ratios of high frequency to bandpass gain.

DETAILED DESCRIPTION

Figure 1:
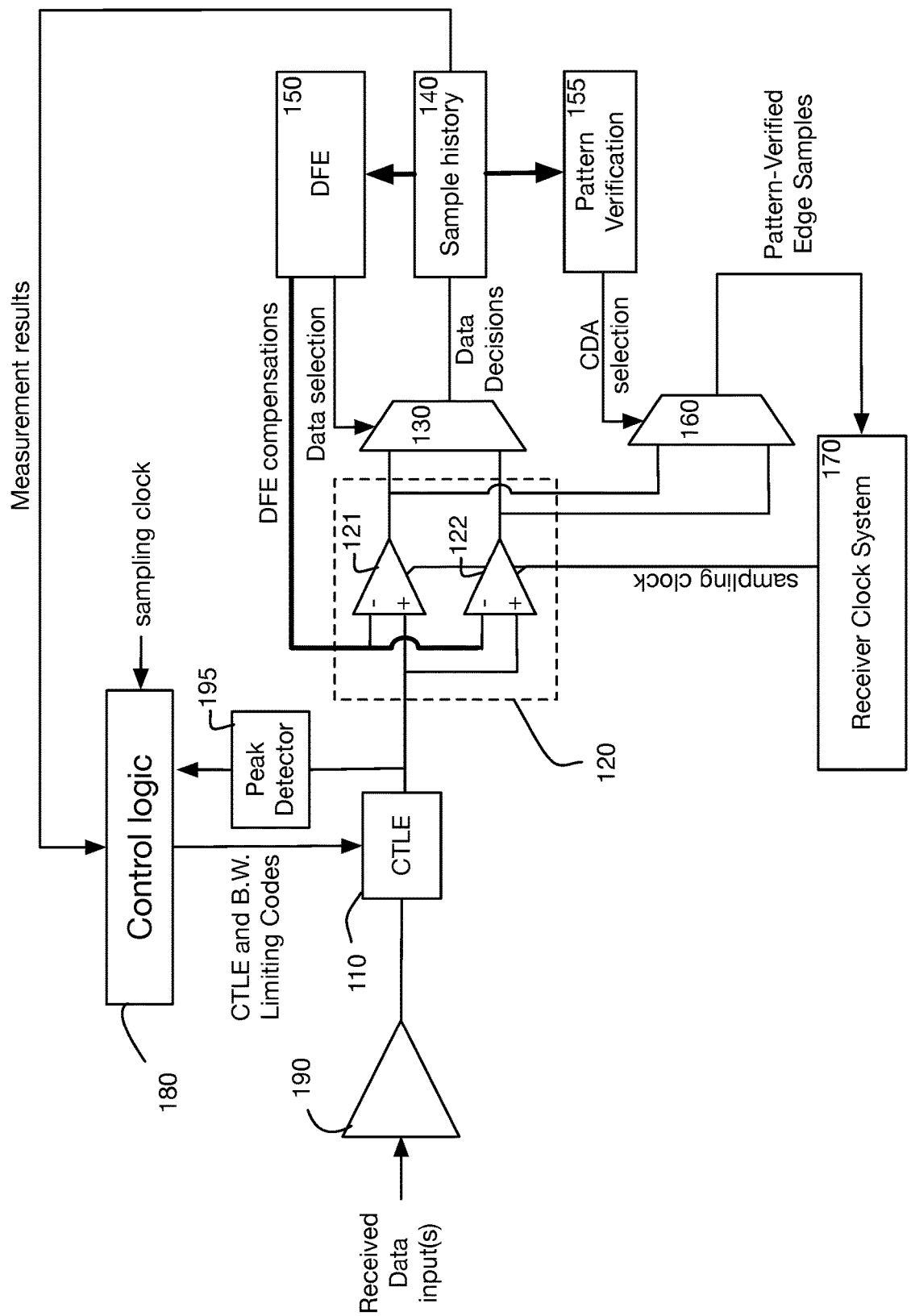
FIG. 1 is a block diagram of a receiver, in accordance with some embodiments.

In recent years, the signaling rate of high speed communications systems have reached speeds of tens of gigabits per second, with individual data unit intervals measured in picoseconds. Depending on the particular coding scheme used, the number of channels comprising such a communications link may range from one to eight or more, and may also communicate one or more clock signals, either within data channels or on separate communications channels.

In one embodiment utilizing a vector signaling code, multiple bits of data are encoded at the transmitter into a vector signaling "codeword", i.e. a set of symbols to be transmitted essentially simultaneously over the multiple wires or channels of the communication medium. As each such wire or channel may take on more than two possible values, each symbol of the codeword is drawn from an alphabet of allowable signal values; representative examples of the art use alphabets of either four or ten values in encodings of five data bits into six symbol codewords. In the receiver, the multilevel wire signals are detected to determine the received codeword, which is then decoded into received data.

A vector signaling code receiver may alternatively detect a combination of received wire signals directly using a multi-input comparator (MIC) performing a weighted summation of two or more wire signals correlated with an orthogonal signaling mode corresponding to a single subchannel (i.e. a single encoded bit) of the whole, and directly producing one bit of received data as a simple binary measurement.

Conventional practice for a high-speed integrated circuit receiver terminates each received signal channel, subchannel, or wire signal in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition.

For descriptive convenience, this document will use the term sampling device, or more simply "sampler" to describe the receiver component that obtains an input measurement, as it implies both the time and amplitude measurement constraints, rather than the similar but less descriptive term "slicer" also used in the art. In some embodiments, the time at which a sample is captured may be adjusted in some or all of the receiver samplers; in some embodiments, the threshold level to which a sample is compared may be adjusted in some or all of the receiver samplers. As one example, the well-known receiver "eye plot" diagram is typically obtained by iterative adjustment of these parameters, with the results plotted graphically as signal amplitudes over time.

Embodiments may apply to any communication or storage methods, including those requiring coordination of multiple channels or elements of the channel to produce a coherent aggregate result.

Receive Signal Equalization

At high data rates, even relatively short and high-quality communications channels exhibit considerable frequency-dependent signal loss, thus it is common for data receivers to incorporate receive signal equalization. Continuous-time Linear Equalization (CTLE) is commonly used to generate an equalized information signal by increasing high frequency gain (and/or lowering low frequency gain) in the receive signal path, in compensation for the increased high frequency attenuation of the channel. Thus, as non-limiting examples, the amount of high frequency signal energy presented to the sampler may be adjusted independent of the mid-frequency signal energy or the low frequency signal energy. In some embodiments, the transition frequency (also known as the filter break-point) between a first and a second frequency range may also be configurable. Thus, a typical CTLE embodiment may have multiple configurable parameters associated with the relative or absolute signal gain the circuit provides over particular frequency ranges. In one embodiment, these parameters are made available as digital values or codes that may be configured or adjusted by a controlling device.

It has also become common practice for data communications receivers to incorporate Decision Feedback Equalization (DFE) to compensate for signal propagation anomalies in the communications medium. The DFE system performs non-linear time-domain equalization on the received signal by maintaining a history of previously-received data values at the receiver, and processing those historic data values with a transmission line model to predict the expected influence each of the historical data values would have on the present receive signal. Such a transmission line model may be pre-calculated, derived by measurement, or generated heuristically, and may encompass the effects of one or more than one previous data interval.

In a typical receiver design, this computed DFE compensation value will be applied to the current receive signal input to produce a corrected signal more accurately representing the received data value. As an example, previous transmission of consecutive "zero" signals might lead to a predicted lower threshold level for a subsequent receiver data measurement, while previous transmission of consecutive "one" signals might lead to a predicted higher threshold level for the same data measurement.

At extremely high data rates, so-called speculative DFE techniques may be used, allowing sampling to occur even though one or more previous data values necessary for the DFE computation are unresolved. In one such embodiment, multiple samples are captured at differing threshold levels corresponding to possible prior data values, with the correct captured value selected for detection once the previous data value has been resolved.

Example Embodiment

For purposes of description and without implying limitation, a serial data receiver as shown in FIG. 1 will be used as an example. To better represent a typical state of the art system, the example receiver includes at least one stage of speculative DFE 150 supported by two data samplers performing concurrent time-sampling operations at two different amplitude thresholds, and a receiver clock system 170 to produce a sampling clock, the phase of which may be adjusted by a clock-data-alignment (CDA) correction to optimize data sampling timing. Two comparators 120 configured to generate two comparator outputs are shown, the comparators configured to compare a received signal to a first threshold as at 121 and a second threshold as at 122, according to a sampling clock, the first and second thresholds determined by an estimated amount of inter-symbol interference associated with the received input. A data decision selection circuit 130 configured to select one of the two comparator outputs as a data decision, the selection based on at least one prior data decision that may be stored in sample history 140. The apparatus further includes a phase-error indication selection circuit 160 configured to select one of the two comparator outputs as a phase-error indication in response to receiving a CDA selection signal from a pattern detection circuit 155 configured to identify a predetermined data decision pattern in the sample history 140. In some embodiments, the apparatus further includes a receiver clock system 170 configured to receive the phase-error indication and to responsively adjust a phase of the sampling clock. In some embodiments, the phase-error indication is an early/late logic decision on a transition of the received signal. In some embodiments, the data decision selection circuit 130 and phase-error indication circuit 160 select different comparator outputs. In some embodiments, the apparatus further includes a decision-feedback equalization (DFE) circuit 150 configured to generate the first and second decision thresholds. In some embodiments, the apparatus further includes a sub-channel detection multi-input comparator 190 (MIC) operating on signals received via a plurality of wires, the sub-channel detection MIC 190 configured to generate the information signal. In other embodiments, a single wire signal or the differential value of two wire signals provides the receive data input, with 190 representing any associated termination, amplification, or line receiver elements generating the information signal.

As described in subsequent examples, FIG. 1 also shows a hardware peak detection element 195 in accordance with some embodiments.

Figure 2:
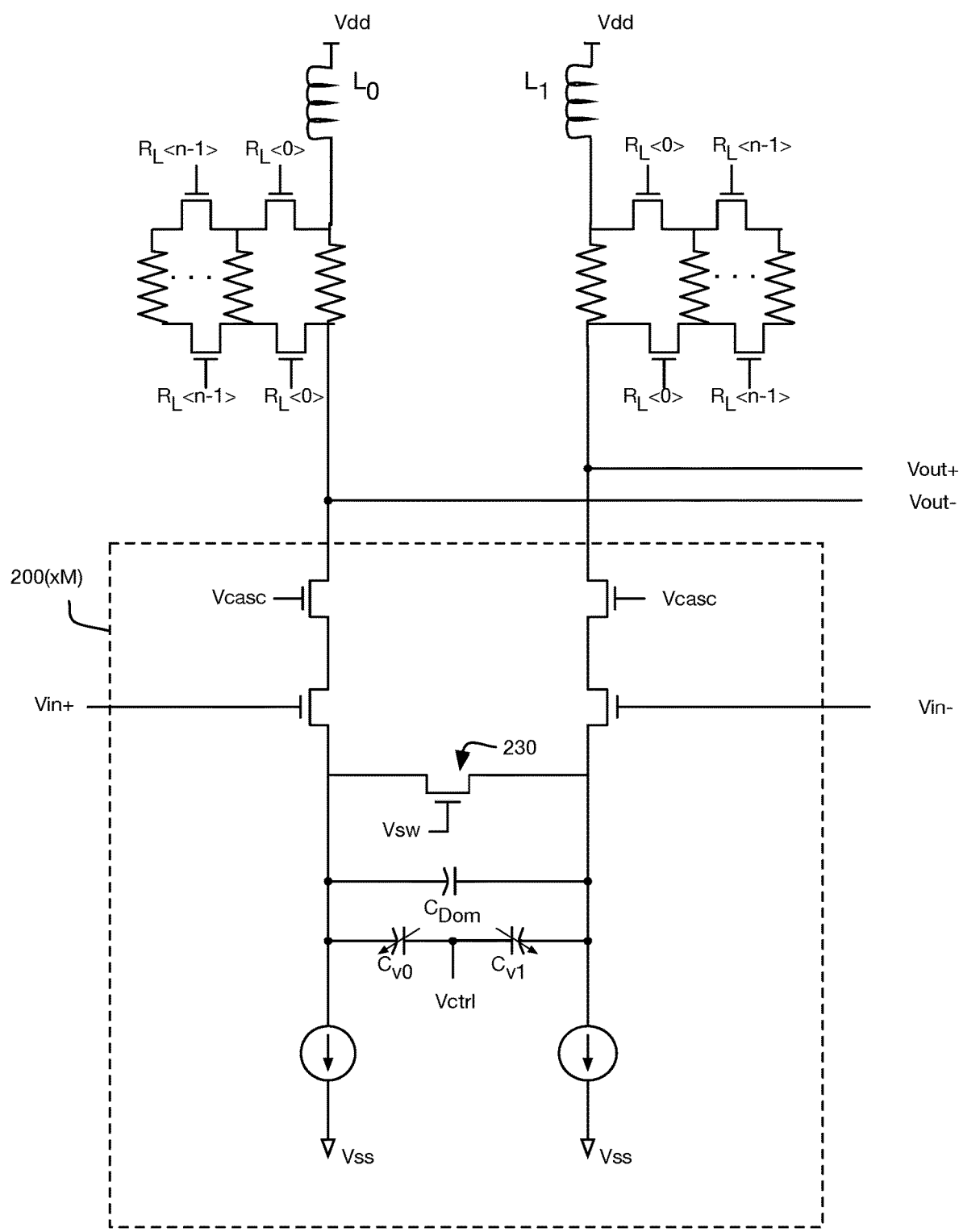
FIG. 2 is a schematic illustrating one CTLE embodiment.

The descriptions and examples herein additionally assume a CTLE 110 circuit as shown in FIG. 2, without implying limitation. In one embodiment using this circuit, CTLE high-frequency gain may be seen to be essentially constant as shown as 310 in the response curve of FIG. 3, with the primary CTLE configurable parameter controlling bandpass gain 320, the combination of which provides the desired adjustable ratio of high frequency to bandpass frequency gain within the equalization circuit, commonly by changing an equalization code or setting in a control register. Some CTLE embodiments also provide secondary configurable parameters, as suggested by variable capacitors 233/234. In some embodiments, this secondary configurable parameter is used to provide an overall CTLE bandwidth limit capability using a similar control mechanism. In other CTLE embodiments known in the art and equally compatible with the present invention, the bandpass gain may be fixed and the amount of high-frequency peaking gain is variable.

Startup

During initiation of receive operations such as at system power-up, the normal synergistic behavior of the various receiver components is not functional. The receiver clock subsystem 170 outputs a sampling clock asynchronous to the received data input(s), thus consecutive results of samplers 121/122 will in general not correspond to valid data and/or clock results, and certainly do not represent the consecutive received samples needed by DFE 150 or Pattern Verification 155. The resulting paucity of Pattern-Verified Edge Samples delays obtaining clock lock, while the lack of Measurement Results from Sample history 140 thwarts optimization of CTLE equalization parameters by Control logic 180.

Some receiver embodiments detect particular sequential transitional data patterns during normal (i.e. locked sampling clock) operation that are associated with, as one example, suitable signal transitions to maintain clock data alignment. Data sequences "01", "10", "010", "101", "0101", "1010", etc. are representative examples of such transitional data patterns. Further embodiments may also identify sequential data patterns associated with high- or low-frequency spectral energy, to inform incremental adjustments of CTLE equalization parameters during normal operation.

As high transition density is associated with a high frequency spectral content, the previous clock transitional pattern examples also represent sequences having substantial high-frequency spectral energy, while transitional data patterns incorporating low frequency of transitions, such as sequences "000", "111", "0000", "1111" are indicative of lower frequency spectral energy.

In this context, reference to high, middle, and low frequency energy may be made relative to the Nyquist frequency of ($\frac{1}{2}$ *UI), where "UI" is the Unit Interval or duration of a single bit time at the signal's data rate. The Fourier transform of a signal consisting of alternating ones and zeroes will have its first or primary energy peak at the Nyquist frequency. Informally, signal energy at lower than the Nyquist frequency is generally associated with signal fidelity across multiple unit intervals, while signal energy above the Nyquist frequency is generally associated with the rise and fall times of signal transitions. Thus, increased high frequency energy (i.e. greater CTLE peaking or high-frequency gain) produces sharper transition edges and thus wider data eyes, but can also lead to slower and less accurate clock lock using a baud-rate CDA system.

Even though individual received data bits and sequences of bits cannot be detected reliably in the absence of a locked receive sampling clock, it is observed that the energy spectrum of such sequences can be observed indirectly. FIG. 4 shows examples of a waveform composed of low-, mid-, and high-frequency signal components in differing ratios. For illustrative purposes, multiple instances of the waveform are superimposed, simulating the absence of a locked sampling clock.

Figure 3:
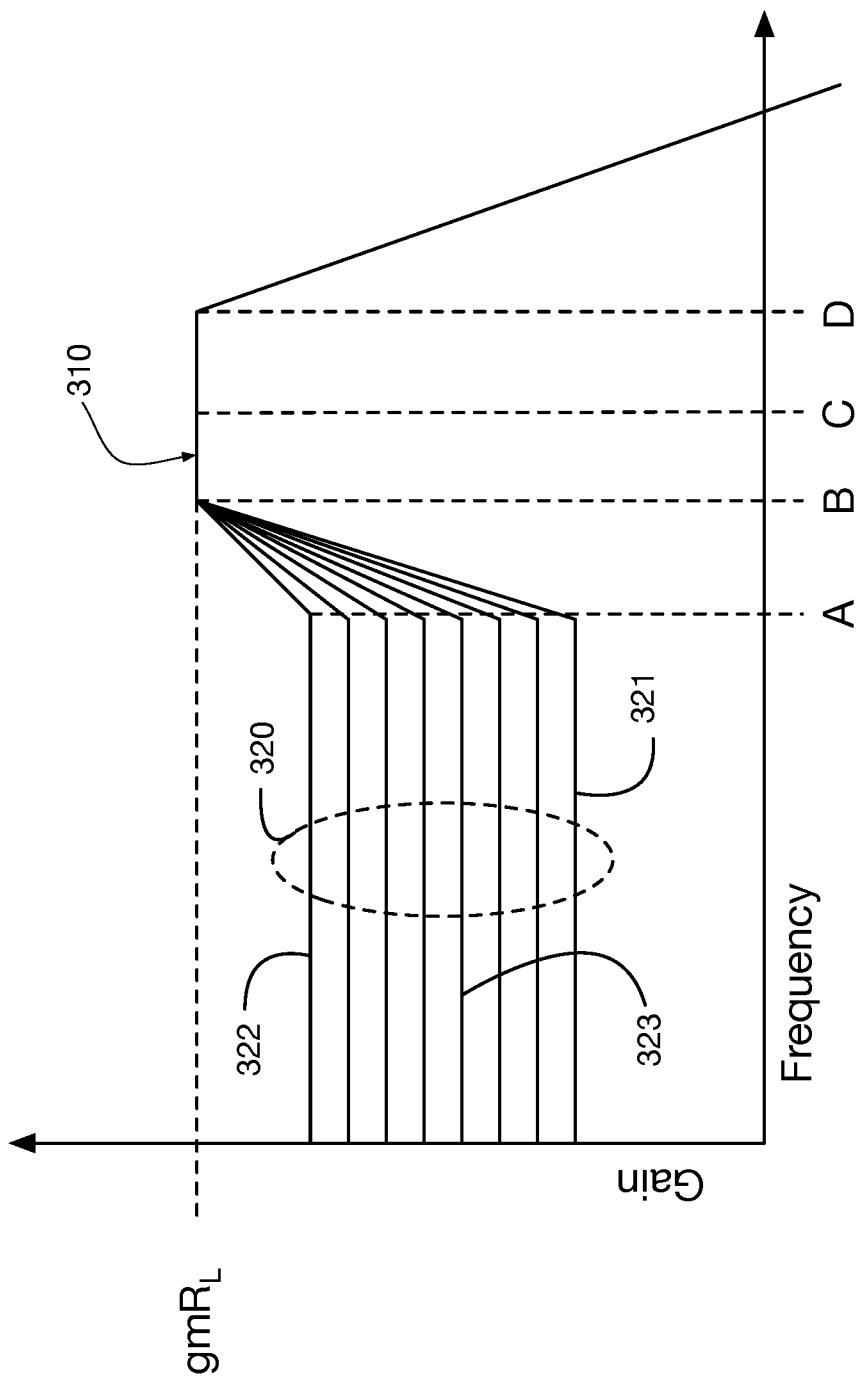
FIG. 3 shows the frequency response of an embodiment as in FIG. 2.

For avoidance of confusion, CTLE equalization settings will subsequently be described first using ratios of high frequency peaking gain to mid-frequency bandpass gain applicable to any CTLE embodiment, then parenthetically as the CTLE configuration setting appropriate for the particular embodiment of FIG. 2 and illustrated in that embodiment's response curve of FIG. 3 as producing the described ratio. In some embodiments, the CTLE code of the CTLE may be a thermometer code having an analog voltage Vsw provided on a selectable number of outputs and provided to source impedance elements 230 within a plurality of M slices 200 connected in parallel to the load impedance.

The signal shown as waveform 410 in FIG. 4 is the result of a large ratio of high frequency to mid-frequency gain (produced by a low bandpass gain setting 321 relative to the fixed amount of high frequency gain 310.) Thus, the peak-to-peak or envelope amplitude of this signal is influenced primarily by the energy of that high frequency spectrum range.

Conversely, the signal shown as waveform 430 is the result of a low ratio of high frequency to mid-frequency gain (produced by a high bandpass gain setting 322 relative to the fixed amount of high frequency gain 310.) Thus, the peak-to-peak or envelope amplitude of this signal is influenced primarily by the energy of the mid-frequency or bandpass spectrum range. Although relative amplitudes depend on both transmission path loss characteristics and CTLE gain characteristics, in most embodiments the peak-to-peak or envelope amplitude of this signal will be as large or larger than that of waveform 410.

Waveform 420 illustrates an intermediate gain ratio (and intermediate gain setting 323) relative to the maximum and minimum settings associated with the previous two waveforms. In some embodiments, the peak-to-peak or envelope amplitude of this signal will be smaller than both waveforms 410 and 430 due to second-order operational effects. In other words, in those embodiments incremental adjustment from the conditions of 410 through 420 to those of 430 will result in a decrease, a minimum, and then an increase of observed peak-to-peak or envelope amplitude. In other embodiments, waveform 420 may not be smaller than 410, but 430 will still be larger; thus in those embodiments the aforementioned incremental adjustment will show an increase, albeit without an intermediary minimum.

Figure 5:
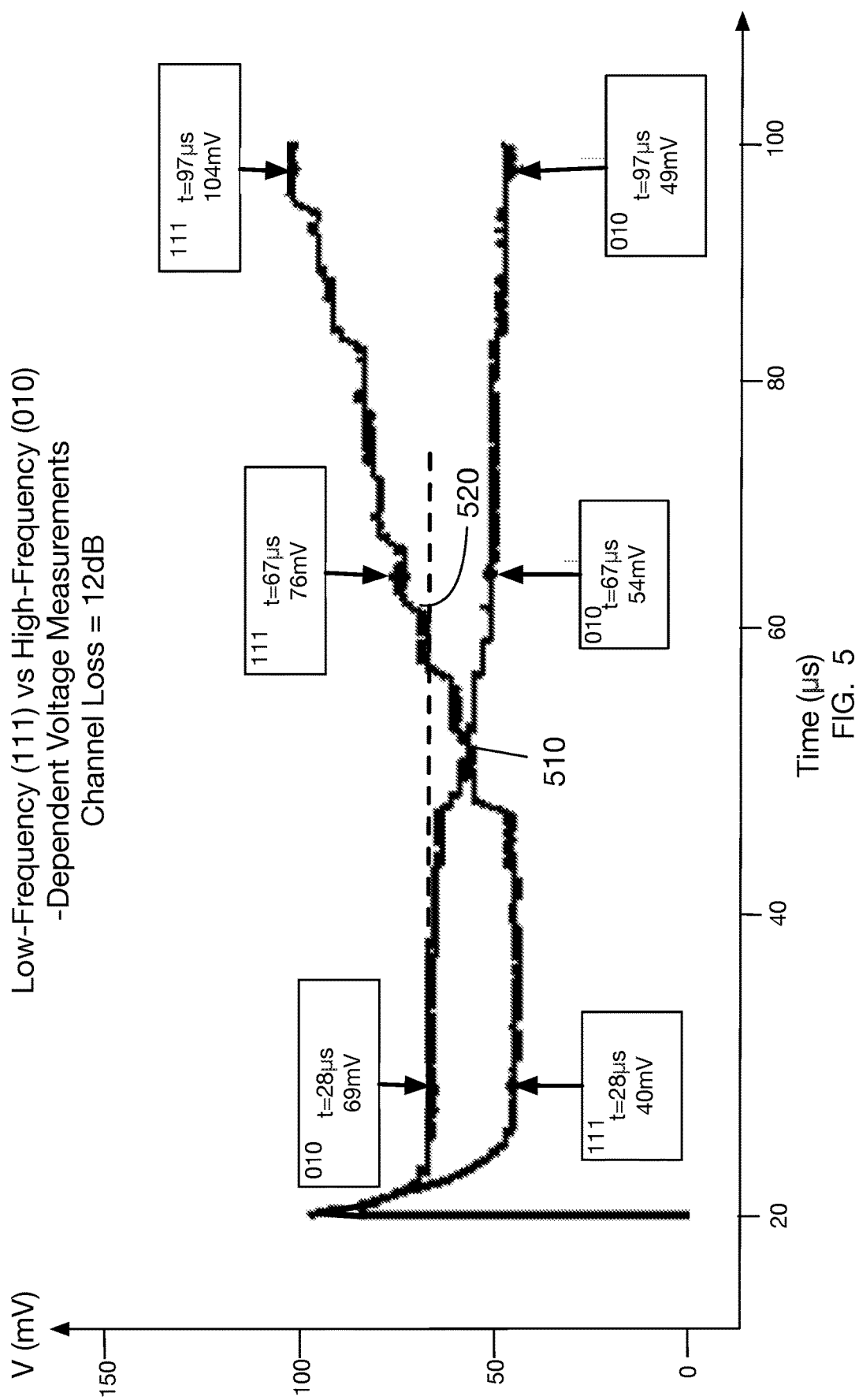
FIG. 5 is a graph showing the high frequency and midfrequency gain of one CTLE embodiment as the equalization control code is changed.

FIG. 5 is a graph showing the high frequency and mid-frequency gain of one CTLE embodiment as the equalization control code is changed. In some embodiments, the initialization procedure described herein attempts to balance the high-frequency and low-frequency energy of the PAM data signal, illustrated in FIG. 5 by the intersection 510 of the signal peak value curves of the '111' and '010' data patterns. While FIG. 5 includes respective curves for the '111' and '010' data patterns, it should be noted that such curves are purely for illustrative purposes and do not imply the need for performing pattern verification. It is assumed that by applying the maximum amount of high-frequency peaking, the initial signal peak value of the PAM data signal will be detected while a '010' or '101' data pattern is occurring without having to explicitly detect these data patterns. Furthermore, larger signal peak values are detected as compared to the initial signal peak value by virtue of the increase in low frequency energy of the PAM data signal as a result of changes to the CTLE code. Furthermore, while the x-axis of FIG. 5 is in units of time, it should be noted that the '010' and '111' curves shown are changing over time as a result of incremental changes in the CTLE code over time.

One embodiment uses a peak detection circuit 195 to estimate the envelope amplitude by measuring the maximum positive (and/or negative) extent of the asynchronous signal. Peak detectors are well represented in the art, the specific design used not being a significant aspect of the invention.

As an alternative to a hardware peak detection circuit, a procedure using the existing samplers and threshold adjustments may be used; the threshold is incrementally increased from its nominal original value (or decreased, for negative extent) until no changes are seen in the detected result across multiple samples. As the sampling occurs randomly due to the asynchronous nature of the clock, a sufficient number of samples should be taken after each threshold adjustment to insure that the final adjusted threshold is just above (below) the overall extent of the received signal.

In one embodiment, a strategy of dynamically adjusting equalization parameters while monitoring the effective peak amplitude of the received signal is used to obtain an initial equalization setting compatible with subsequent receiver operation. It is assumed that the incoming data stream during this procedure consists of a typical mixed data stream presenting a balanced spectrum of low-, mid-, and high-frequency components.

Figure 6:
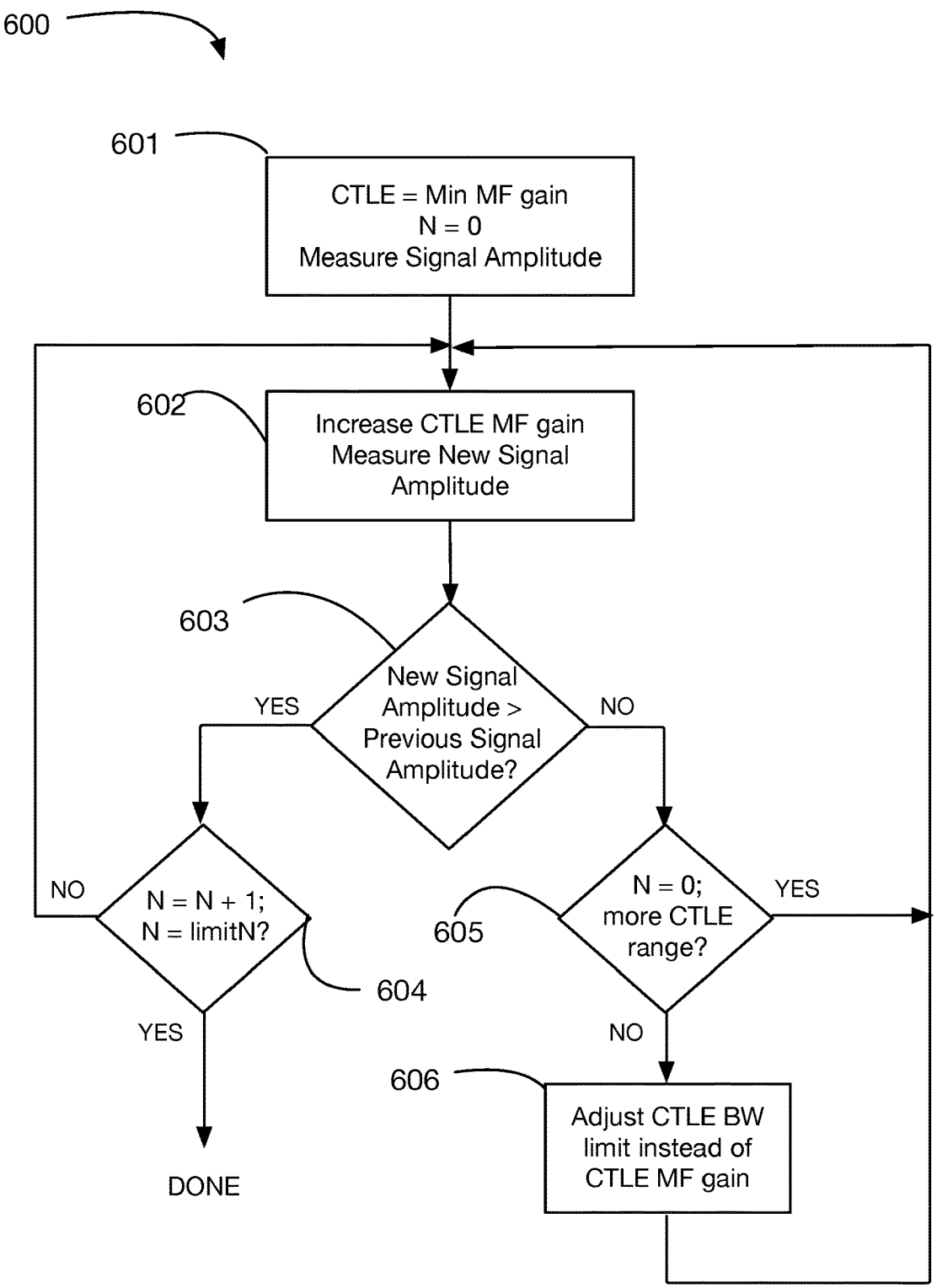
FIG. 6 is a flow chart illustrating one embodiment of a method in accordance with the invention.

FIG. 6 is a flow chart of a method 600 in accordance with some embodiments, which may be performed within e.g., control logic 180. As shown, method 600 includes setting 601 the ratio of CTLE high frequency to bandpass gain to its maximum amount or highest ratio (alternatively, setting the bandpass gain to its minimum level relative to a fixed level of high frequency gain) and setting any CTLE bandwidth limitation to its highest frequency setting or minimum effectiveness. Step 601 further includes measuring, using a signal peak detector circuit or procedure, the signal peak value of the received signal when the ratio of high-frequency energy to low-frequency energy of the PAM data signal is at a maximum, and recording this peak value. Method 600 further includes incrementally decreasing 602 the ratio of CTLE high frequency to bandpass gain in steps (alternatively, incrementally increasing bandpass gain relative to a fixed high frequency gain) while monitoring 603 the signal peak value, until an increase in the measured signal peak value is noted 604 for at least N consecutive decrease steps. If the ratio of CTLE high frequency equalization to bandpass gain reaches 605 its minimum limit or extent (or bandpass gain reaches its maximum extent) incrementally adjusting 606 the CTLE bandwidth limit control. In such embodiments, adjusting 606 the CTLE bandwidth limit control may include lowering the frequencies of e.g., points A, B, and D in FIG. 3 in each subsequent step. Alternative embodiments may lower the peak magnitude C via adjustments to e.g., the load resistance of the CTLE to provide bandwidth limit control.

The method 600 provides a startup initialization of CTLE (and in some cases, bandwidth control settings) of the PAM data signal that approximately balances the amount of high-frequency energy in the PAM data signal and the low-frequency energy in the PAM data signal, as described above with relation to waveform 420 of FIG. 4, and the initialized CTLE high frequency equalization and bandwidth settings may then be utilized for subsequent receiver bring-up operations.

The value of N used in this procedure may vary depending on the granularity of the incremental adjustment steps and the particular receiver design characteristics and may be determined heuristically during initial design or prototype testing. One may observe that continuing the incremental adjustment and testing by "N" steps has two effects; first, providing some measure of statistical smoothing of the test results to avoid spurious measurement errors, and second increasing the final equalization setting by N times the adjustment increment amount. Other embodiments may incorporate other smoothing or transient measurement avoidance mechanisms, and/or may simply offset the final equalization settings by a predetermined amount, resulting in a fully equivalent alternative to the described method.

Figure 7:
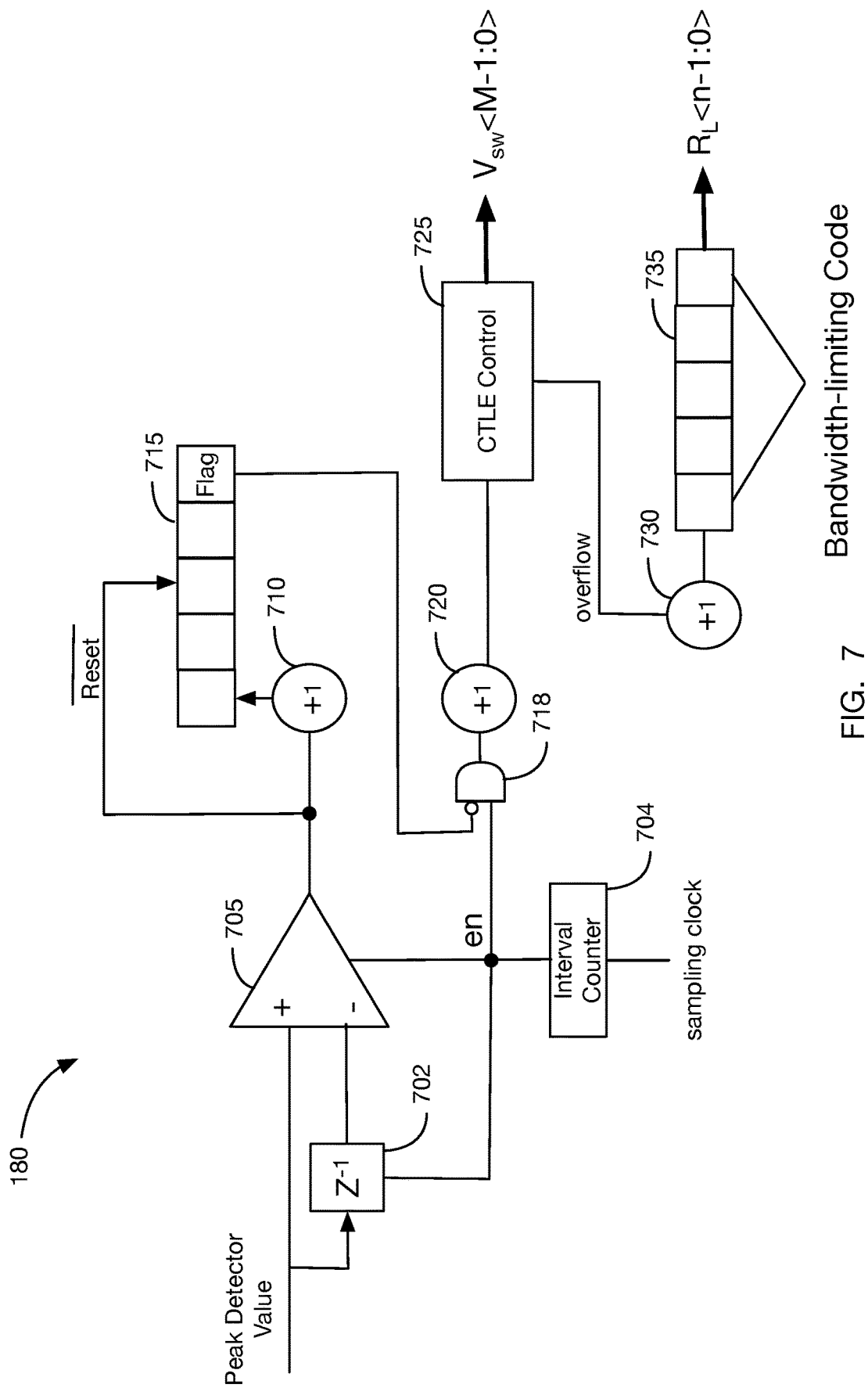
FIG. 7 is a block diagram of control logic, in accordance with some embodiments.

FIG. 7 is a block diagram of control logic 180, in accordance with some embodiments. During system startup, the CTLE control 725 may include a multi-bit counting register for storing part of (or all of) the CTLE code and may be initialized to a code value that maximizes the amount of high-frequency energy of the PAM data signal relative to the low-frequency energy of the PAM data signal, e.g., the setting for 321 as shown in FIG. 3. For the purposes of the following description, the control logic 180 makes increments 720 to the CTLE code stored in CTLE control 725 to increase the amount of low-frequency energy relative to the high-frequency energy, however similar embodiments that decrement the value of multi-bit counting register to decrease high-frequency peaking may be envisioned as well.

As shown, control logic 180 includes a comparator 705 configured to compare the current peak detector value received from peak detector 195 to the previously measured peak detector value, illustrated by delay unit 702. As shown, control logic 180 includes a frame counter 704 that may be configured to allow control logic 180 to make comparisons of the signal peak values and increments to the CTLE code periodically according to e.g., a frame of measurements made on the PAM data signal. Once the interval counter 704 indicates a full frame has been completed, a bit of the frame counter 704 corresponding to an enable signal 'en' may initiate (i) comparator 705 to make a comparison, (ii) the delay unit 702 to replace the previously measured signal peak value with the most recent measured signal peak value, and (iii) increment 720 the CTLE code stored in multi-bit counting register within CTLE control 725 to incrementally reduce high-frequency peaking of the PAM data signal. As shown, the CTLE code in CTLE control 725 is incremented when the logical AND 718 of enable signal 'en' provided by frame counter 704 is high and the flag bit of multi-bit counting register 715 is low (illustrated by the inverting input to logic AND 718). In such embodiments, continuously monitoring the previously-stored detected peak value may determine intersection point 510 in FIG. 5, which corresponds to the increase in low-frequency energy relative to the high-frequency energy of the PAM data signal while accounting for some lossy-ness in high-frequency gain associated with changing the amount of equalization.

In alternative embodiments, delay unit 702 may correspond to a register configured to store the initial max signal peak value associated with the high frequency content of the PAM data signal, and after each frame of signaling intervals as determined by interval counter 704 is compared to the initial max signal peak value. In such embodiments, the CTLE code associated with the increase in signal peak value may be determined at point 520, at which point the low frequency energy of the PAM data signal has surpassed the initially determined high frequency energy of the PAM data signal.

Comparator 705 is configured to detect increases in the signal peak value responsive to changes of the CTLE code stored in multi-bit counting register in CTLE control 725, and upon each detected increase, the least-significant bit (LSB) of multi-bit counting register 715 is incremented 710 via an active-high input indicating that the current signal peak value is higher than the previous signal peak value. In some embodiments, multi-bit counting register 715 may further include an active-low reset input 'reset' that is used when detecting consecutive increases in the signal peak value, and thus if the output of comparator 705 indicates that there is no increase in detected signal peak value, the value of multi-bit counting register in CTLE control 725 is reset to 0. Multi-bit counting register 715 further includes a flag bit stored in a most-significant bit (MSB) portion of the register that may correspond to the 'N' desired number of consecutive increases, as described above. Once 'N' consecutive increases in signal peak value have been detected, increments to the CTLE code stored in multi-bit counting register in CTLE control 725 may be halted via the flag bit reaching a 'high' value.

Figure 8:
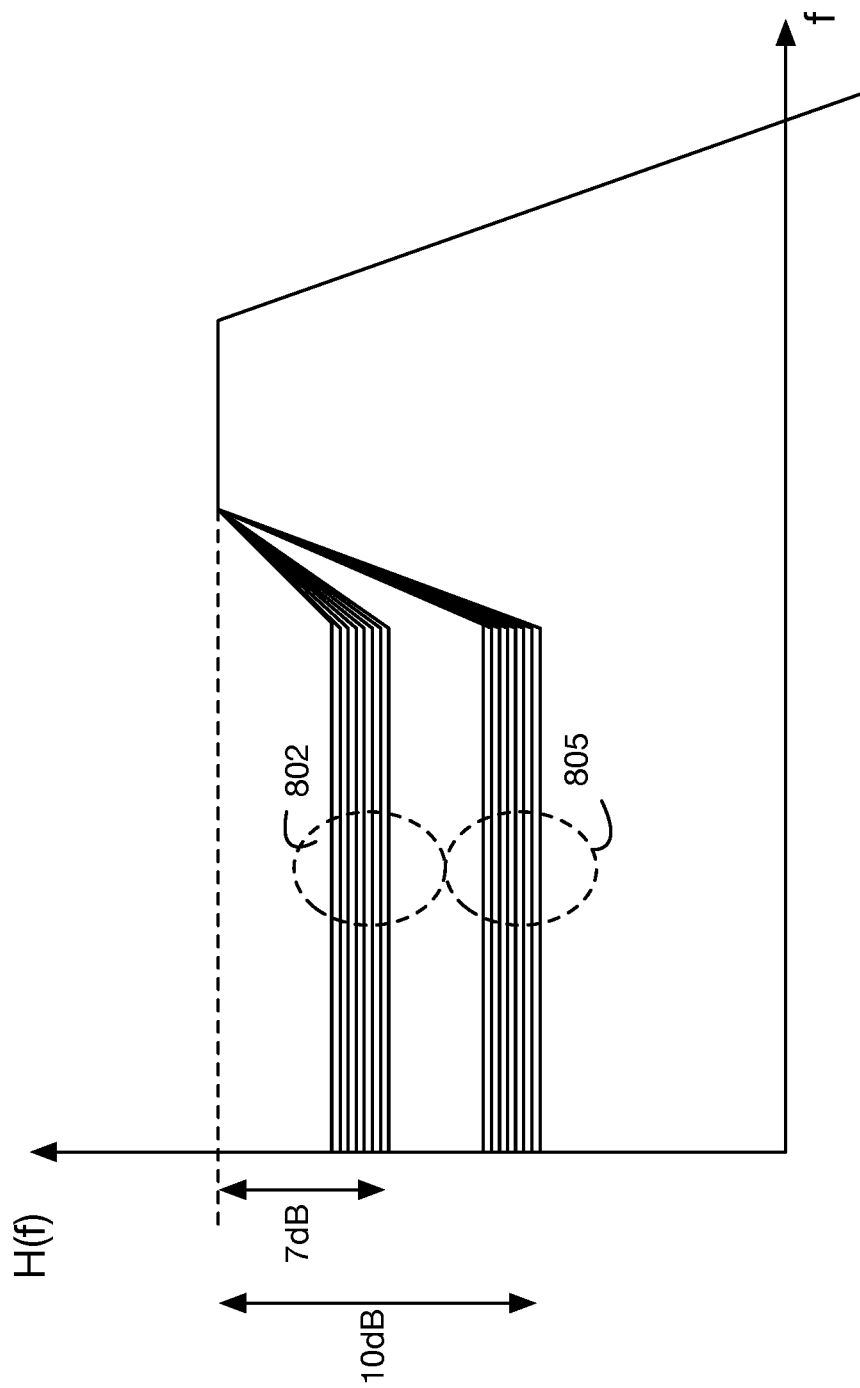
FIG. 8 is a graph of a frequency response illustrating coarse and fine settings of a CTLE, in accordance with some embodiments.

Embodiments above describe storing the CTLE code in a multi-bit counting register. In further embodiments, the CTLE control 725 may further include a digital-to-analog converter (DAC) and thermometer encoder. In such embodiments, the DAC may be used to convert the multi-bit value stored in the multi-bit counting register into an analog voltage Vsw, and the thermometer encoder may be configured to provide the analog voltage Vsw to the source impedance elements 230 of a selectable number of slices according to a thermometer code (shown in FIG. 7 as CTLE code Vsw<M−1:0>). In such embodiments as described in [Rattan], a number of slices 200 receiving the analog voltage (with the remaining slices "disabled" or set in an "open" configuration) sets a fine setting of the high-frequency equalization of the PAM data signal (see FIG. 8, individual lines within groups 802 and 805), and the impedance value of the source impedance elements 230 as determined by the analog voltage Vsw sets a coarse setting of the high-frequency equalization of the PAM data signal (see FIG. 8, groups 802 and 805 representing respective coarse settings). In one example, as the analog value of multi-bit counting register within CTLE control 725 reaches an extreme value associated with a maximum impedance value of source impedance element 230, the thermometer encoder may enable an additional slice 200 of the CTLE.

In an alternative embodiment, the CTLE control 725 steps through the number of slices 200 receiving a given analog voltage Vsw before adjusting the analog voltage Vsw itself. In one such embodiment, the CTLE of FIG. 2 may be initialized with all slices 200 enabled, and the analog voltage Vsw being associated with a minimum impedance of source impedance element 230. Such a setting initializes the CTLE in a maximum high-frequency peaking configuration. The CTLE control 725 may first adjust the thermometer portion of the code to incrementally disable (e.g., set the source impedance elements 230 to an 'open' or high impedance configuration) the number of slices 200 receiving the voltage Vsw associated with the value stored in CTLE control 725. Once the number of slices receiving the analog voltage reaches a minimum, the analog value Vsw portion of the control signal may be adjusted to effectively increase the impedance of source impedance elements 230, and the thermometer encoder may again provide the new analog voltage to all slices 200 of the CTLE and continue to incrementally reduce the number of slices 200 receiving the analog voltage. Such an embodiment incrementally steps through the "fine" settings of the equalization before making adjustments to the "coarse" settings of the equalization, however embodiments operating in reverse order may be considered as well (e.g., stepping through all possible analog voltages Vsw before changing the number of enabled slices 200).

In some embodiments, control logic 180 may be configured to store and output a bandwidth-limiting control signal. In such embodiments, the bandwidth-limiting control may be stored in multi-bit counting register 735, which is only incremented when the CTLE has run out of equalization room. In such embodiments, the control logic 180 may be configured to output the CTLE code associated with minimum high-frequency peaking (e.g., line 322 of FIG. 3), and may begin adjusting bandwidth control via e.g., a bandwidth-limiting code provided to the load impedance $R_L$ of the CTLE shown in FIG. 2. In some such embodiments, the multi-bit counting register 735 may be configured to store a thermometer code, and each load impedance element $R_L$<n-1>:$R_L$<0> may have equivalent resistances. In alternative embodiments, the load impedance elements $R_L$<n-1>: $R_L$<0> may have differing resistance (e.g., R, 2R, 4R, etc.) and the multi-bit counting register may store a binary value indicative of the load impedance. While adjusting the source impedance elements 230 of the CTLE of FIG. 2 increases the amount of low-frequency gain while maintaining a relatively constant high-frequency gain, the bandwidth limiting control actively attenuates the amount of high-frequency gain to balance the high and low frequency energies of the PAM data signal.

While embodiments above describe finding the CTLE code associated with the initial increases in signal peak value, it should be noted that the above algorithms may be extrapolated to find larger amounts of low-frequency energy of the PAM data signal relative to the high-frequency energy of the PAM data signal. For example, after determining the initial signal peak value associated with the high frequency of the PAM data signal, the CTLE code may be adjusted until the signal peak detector identifies a signal peak value that is larger than the initial signal peak value by a predetermined amount. In such embodiments, the multi-bit counting register 715 may be configured to count a larger predetermined number of signal peak increases (i.e., a number associated with an approximate magnitude rather than the confidence check). Alternatively, the CTLE code may be adjusted until the peak detector value reaches a ratio-metric increase (e.g., 2× the voltage of the initial measured signal peak), an absolute mV increase relative to the initial measured signal peak, or various other predetermined amounts. Such equalization codes may correspond to e.g., the values at t=97 μs, where the low-frequency peak is approximately 50% higher than the initial signal peak value (or 35 mV of absolute increase relative to the initial signal peak value, depending on the embodiment used). In some embodiments, the flag bit stored in multi-bit counting register 715 may further be purposed to initiate the next step in the startup/calibration process.

The invention claimed is:

1. A method comprising:
   obtaining a first signal peak value of a pulse-amplitude modulated (PAM) data signal associated with high frequency energy of the PAM data signal at an output of a continuous time linear equalizer (CTLE) utilizing a peak detector;
   measuring a signal value of the PAM data signal, and continually reducing equalization of the PAM data signal via changes to an equalization code to increase low frequency energy of the PAM data signal until the signal value increases above the first signal peak value of the PAM data signal; and
   outputting the equalization code associated with the signal value increasing above the first signal peak value.

2. The method of claim 1, wherein obtaining the first signal peak value comprises asynchronously generating samples of the PAM data signal, and comparing each sample of the PAM data signal to a variable reference voltage.

3. The method of claim 2, wherein the variable reference voltage is adjusted responsive to the comparison of each sample to the variable reference voltage.

4. The method of claim 1, further comprising detecting a predetermined number of consecutive incremental changes to the equalization code that increase the signal value above the first signal peak value.

5. The method of claim 4, wherein outputting the equalization code associated with the signal value increasing above the first signal peak value comprises outputting an equalization code associated with a first increase in the signal value above the first signal peak value.

6. The method of claim 1, wherein the signal value increasing above the first signal peak value is indicative of the low frequency energy of the PAM data signal surpassing the high frequency energy of the PAM data signal.

7. The method of claim 1, wherein each signal peak value of the PAM data signal is measured during a frame of unit intervals.

8. The method of claim 7, wherein the detected increase in the signal value above the first signal peak value of the PAM data signal occurs upon completion of a corresponding frame of unit intervals.

9. The method of claim 1, wherein detecting the signal value increasing above the first signal peak value of the PAM data signal relative to the signal peak value associated with the high frequency energy of the PAM data signal comprises determining the signal value that is larger than the first signal peak value by a predetermined amount.

10. The method of claim 1, wherein the equalization code comprises a bandwidth-limiting code, the bandwidth-limiting code provided to the CTLE to attenuate the high frequency energy of the PAM data signal.

11. An apparatus comprising:
    a peak detector configured to obtain a first signal peak value associated with high frequency energy of the pulse amplitude modulation (PAM) data signal;
    a continuous time linear equalizer (CTLE) configured to continually reduce equalization of the PAM data signal via changes to an equalization code to increase low frequency energy of the PAM data signal until a signal value increases above the first signal peak value; and
    a control logic circuit configured to measure the signal value of the PAM data signal and to output the equalization code associated with the signal value increasing above the first signal peak value.

12. The apparatus of claim 11, wherein the peak detector is configured to obtain the first signal peak value by asynchronously generating samples of the PAM data signal, and compare each sample of the PAM data signal to a variable reference voltage.

13. The apparatus of claim 12, wherein the variable reference voltage is adjusted responsive to the comparison of each sample to the variable reference voltage.

14. The apparatus of claim 11, wherein the control logic circuit is configured to detect a predetermined number of incremental changes to the equalization code that increase the signal value above the first signal peak value.

15. The apparatus of claim 14, wherein the equalization code associated with the signal value increasing above the first signal peak value corresponds to an equalization code associated with a first increase in the signal value above the first signal peak value.

16. The apparatus of claim 11, wherein the signal value increasing above the first signal peak value is indicative of the low frequency energy of the PAM data signal surpassing the high frequency energy of the PAM data signal.

17. The apparatus of claim 11, wherein the control logic circuit comprises a frame counter configured to determine a frame of unit intervals, and wherein the signal value of the PAM data signal is measured during a corresponding frame of unit intervals.

18. The apparatus of claim 15, wherein the increase in the signal value above the first signal peak value of the PAM data signal occurs upon completion of the corresponding frame of unit intervals.

19. The apparatus of claim 11, wherein the control logic is configured to determine the signal value that is larger than the first signal peak value of the PAM data signal by a predetermined amount.

20. The apparatus of claim 11, wherein the equalization code comprises a bandwidth-limiting code, the bandwidth-limiting code provided to the CTLE to attenuate the high frequency energy of the PAM data signal.

* * * * *